United States Patent [19]
Yu et al.

[11] Patent Number: 5,793,096
[45] Date of Patent: Aug. 11, 1998

[54] MOS TRANSISTOR EMBEDDED INDUCTOR DEVICE USING MULTI-LAYER METALLIZATION TECHNOLOGY

[75] Inventors: Hyun-Kyu Yu; Cheon-Soo Kim; Kee-Soo Nam, all of Daejeon, Rep. of Korea

[73] Assignee: Electronics and Telecommunications Research Institute, Daejeon, Rep. of Korea

[21] Appl. No.: 846,422

[22] Filed: Apr. 30, 1997

[30] Foreign Application Priority Data

Dec. 21, 1996 [KR] Rep. of Korea ............... 96-69792

[51] Int. Cl.[6] .................................................. H01L 29/00
[52] U.S. Cl. ........................................... 257/531; 257/528
[58] Field of Search .................................. 257/503, 531, 257/528

[56] References Cited

U.S. PATENT DOCUMENTS

| | | | |
|---|---|---|---|
| 5,627,458 | 5/1997 | Nevin | 323/267 |
| 5,629,553 | 5/1997 | Ikeda et al. | 257/531 |

OTHER PUBLICATIONS

Bunghartz, J.N., et al. *High-Q Inductors in Standard Interconnect Technology and its Application to an Integrated RF power Amplifier*, IEDM, pp. 1015-1017.

Nguyen, N.M., et al. *A 1.8-GHz Monolithic LC Voltage-Controlled Oscillator*, IEEE Journal of Solid-State Circuits, vol. 27, No. 3, Mar. 1992.

*Primary Examiner*—Sara W. Crane
*Assistant Examiner*—Douglas A. Wille
*Attorney, Agent, or Firm*—Cohen, Pontani, Lieberman & Pavane

[57] ABSTRACT

An inductor device with a MOS transistor internally installed is disclosed, in which an inductor can be arbitrarily connected in series or in parallel to the respective terminals of MOS transistors by applying a multi-layer wiring technique, thereby reducing the chip area. Within an inductor structure, MOS transistors which have an active region width of W μm are formed in the number of n, and an inductor wire is connected to an arbitrary terminal of the MOS transistors by employing a multi-layer metal wiring process. Thus the inductor is connected to an arbitrary terminal of the MOS transistors in series. Thus an inductor device in which MOS transistors having a channel width of W×n μm are internally installed is formed.

11 Claims, 6 Drawing Sheets

FIRST    SECOND    n

MOS TRANSISTOR EMBEDDED INDUCTOR DEVICE USING MULTI-LAYER METALLIZATION TECHNOLOGY

BACKGROUND OF THE INVENTION

1. Field of the Invention

The present invention relates to an inductor of a semiconductor device. Particularly, the present invention relates to an inductor device with a MOS transistor internally installed, in which an inductor can be arbitrarily formed in series or in parallel to the respective terminals of MOS transistors by applying a multi-layer wiring technique.

2. Description of the Prior Art

Generally, a MOS transistor (MOSFET) has a large input (or gate) capacitance, and therefore, in the case where it is applied to a radio frequency integrated circuit (RF IC), an input matching circuit for an efficient power transmission requires inductors. An inductor which is required in an RF CMOS circuit of 1–2 GHz band requires a value of several nH. The size (length of one side) of the inductor for meeting this value is 100–300 μm in the case of a silicon substrate, and this size is larger than that of a CMOS device.

In actual, the number of inductors for matching the input and output of an RF module (e.g., a low noise amplifier, a frequency mixer and the like) is at least two or more. In this case, the area of the chip is decided mostly by the size of the inductors.

The present invention pertains to an application field of RF devices which belongs to several hundreds of MHz to several GHz. The core of the technique of this application field is the impedance matching technique which is used for efficiently transmitting RF signals. The impedance matching circuit includes inductors, resistors, and capacitors, but the constitution of the impedance matching circuit is varied depending on the characteristics of the active elements, the applied frequency band and the like.

Particularly, the impedance matching circuit which has an active element having a large input capacitance like the MOS transistor necessarily requires inductors. So far, the inductors are connected to the gates of the MOS transistors.

A conventional MOS transistor input impedance matching circuit will be described referring to FIG. 1.

FIG. 1a illustrates a conventional impedance matching circuit in which an inductor 3 is connected in series between a MOS transistor 1 and a gate 2 of the MOS transistor.

FIG. 1b is an actual plan view of the circuit of FIG. 1a. Referring to FIG. 1b, a first metal wire 5 of an inductor 13 is connected through a connection point 8 to a gate 7 of a MOS transistor 9 in series. A second metal wire 4 of the inductor 13 is connected through a connection point 6 to the first metal wire 5. The MOS transistor 9 includes a source (or drain) 10, a drain (or source) 11 and a gate 7, while the source and the drain are connected through connection points 12 to metal wires 14-a and 14-b respectively.

However, in the above described conventional impedance matching circuit, the inductor and the MOS transistor are formed separately, with the result that the chip area is unavoidably increased.

SUMMARY OF THE INVENTION

The present invention is intended to overcome the above described disadvantages of the conventional technique.

Therefore it is an object of the present invention to provide an inductor device with MOS transistors internally installed, in which the large occupation area of the inductor is considered, and MOS transistors are formed under the bottom of the inductor, thereby decreasing the total area of the device.

It is another object of the present invention to provide an inductor device with MOS transistors internally installed, in which an inductor is arbitrarily connected in series or in parallel to the respective terminals of the MOS transistors, thereby making it possible to design the RF IC in a diversified manner.

In achieving the above objects, the semiconductor circuit according to the present invention includes: a plurality of transistors having an arbitrary active region width, and formed in one row; a first metal wire commonly connected to a part of active regions of the transistors; a second metal wire commonly connected to a part of the active regions not connected to the first metal wire; and at least one or more inductor wires overlapped with the gates of the transistors, and electrically connected to the gates.

In another aspect of the present invention, the semiconductor circuit according to the present invention includes: a plurality of transistors having an arbitrary active region width, and formed in one row; a first metal wire commonly connected to a part of active regions of the transistors; a second metal wire commonly connected to gates of the transistors; insulating layers and inductor metal wires alternately formed upon the plurality of the transistors; a plurality of openings for exposing a part of the active regions of the transistors not connected to the first metal wire; and a multi-layer metal wire for electrically connecting the plurality of the transistors through the plurality of the openings to the inductor metal wires.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

Figure 1A:
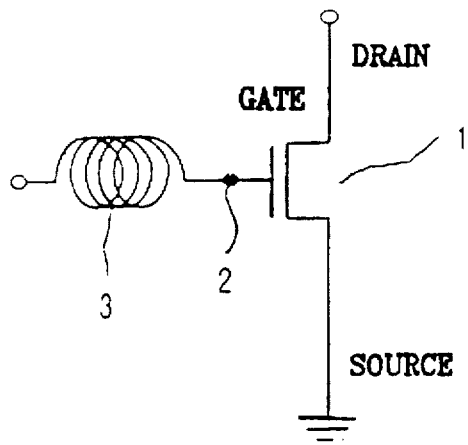
FIG. 1a illustrates a conventional MOS transistor input impedance matching circuit using an inductor.
Figure 1B:
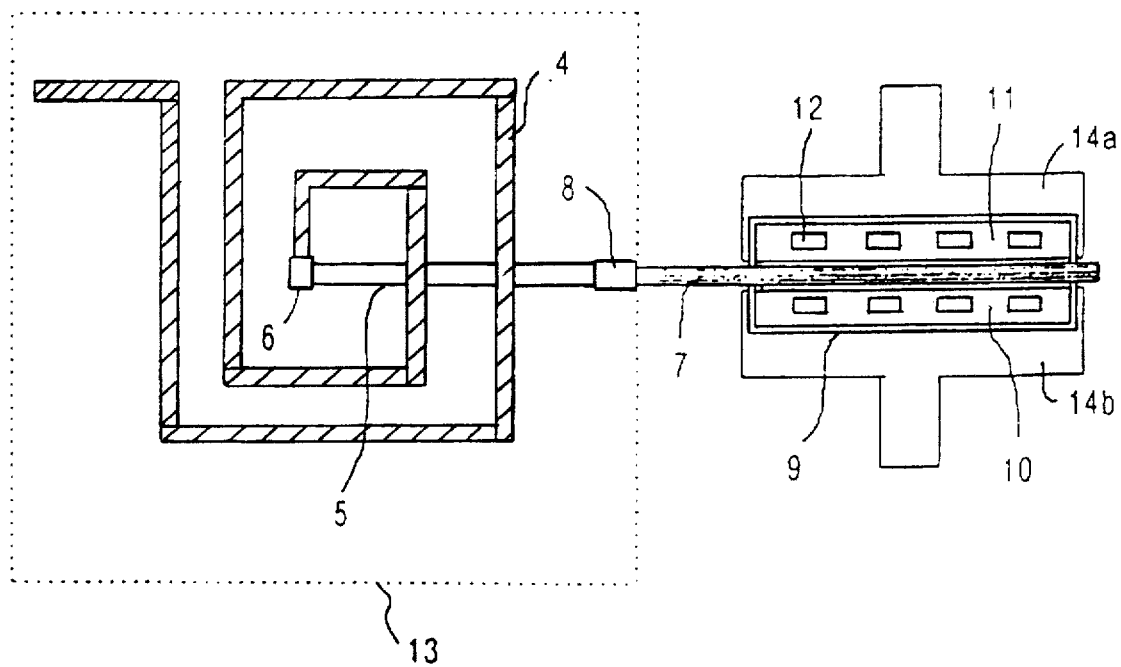
FIG. 1b is a plan view of the conventional impedance matching circuit.
Figure 2:
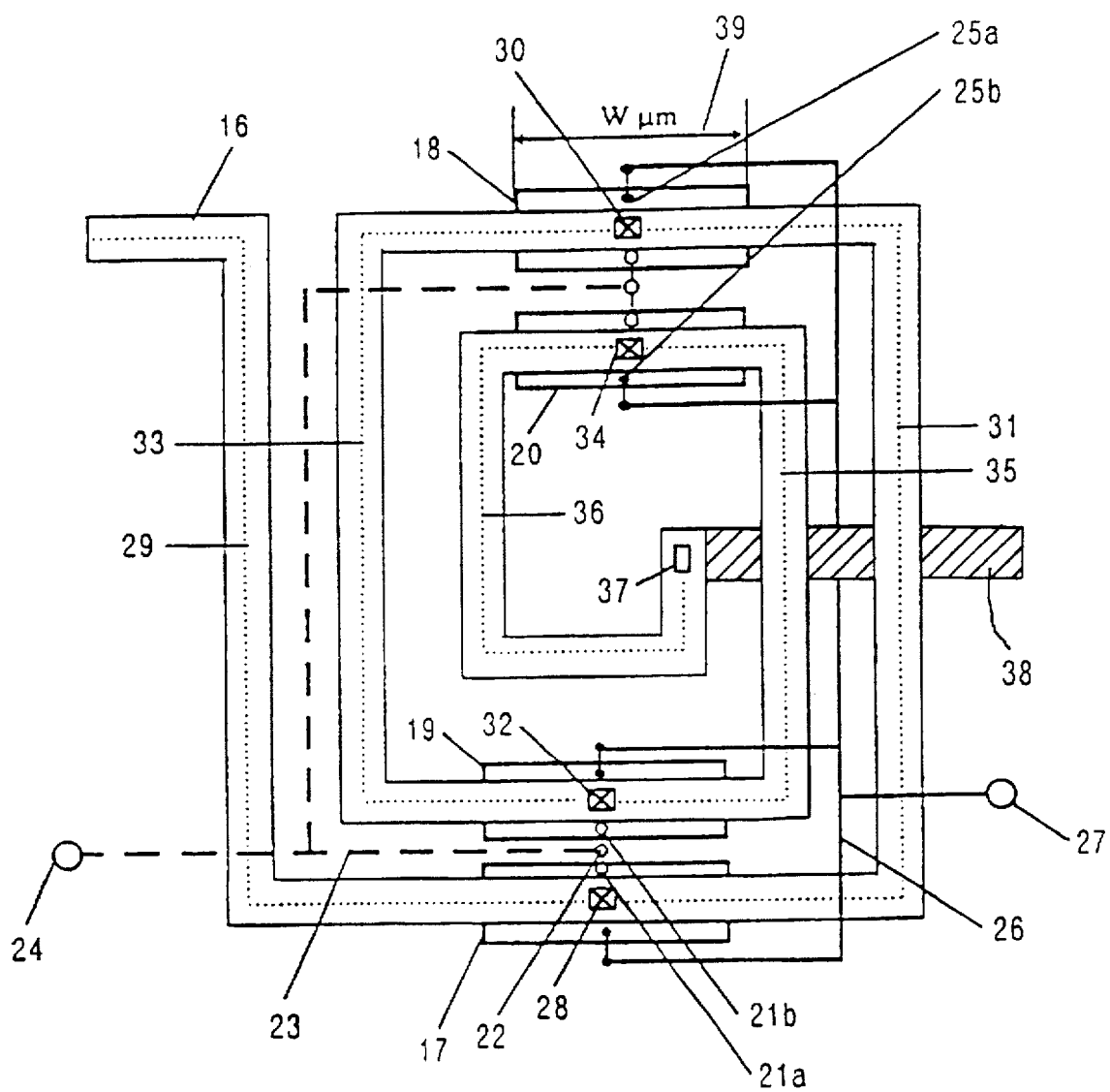
FIG. 2 is a plan view showing the inductor device with MOS transistors internally installed according to the present invention.

FIG. 2 is a conceptional view showing an inductor device with MOS transistors internally installed.

Active elements, i.e., active regions of MOS transistors such as a first active region 17, a second active region 18, a third active region 19 and a fourth active region 20 are formed in the direction of the wires of an inductor 16. To them, there are connected sources, drains and gates of the MOS transistors.

In this preferred embodiment of the present invention, drains 21a and 21b of the transistors are connected through a first metal wire 23 to a common drain 24 at a contact point 22. Sources 25a and 25b are connected through a second metal wire 26 to a common source 27. A gate is connected through a third metal wire (inductor wire) 16 and a contact 28. In another preferred embodiment of the present invention, the source, the drain and the gate can be used in an exchanged manner.

Figure 3A:
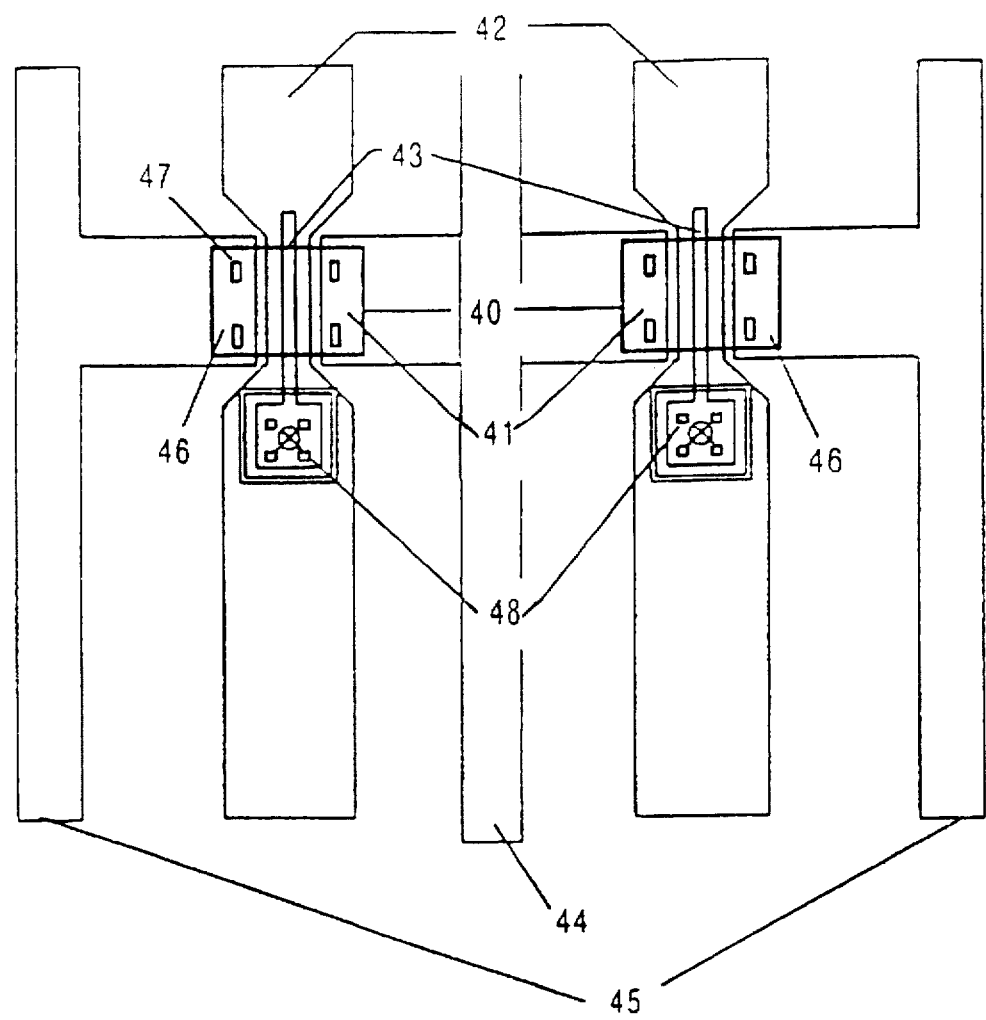
FIG. 3a is a plan view showing a portion at which the MOS transistor of FIG. 2 crosses the inductor.
Figure 3B:
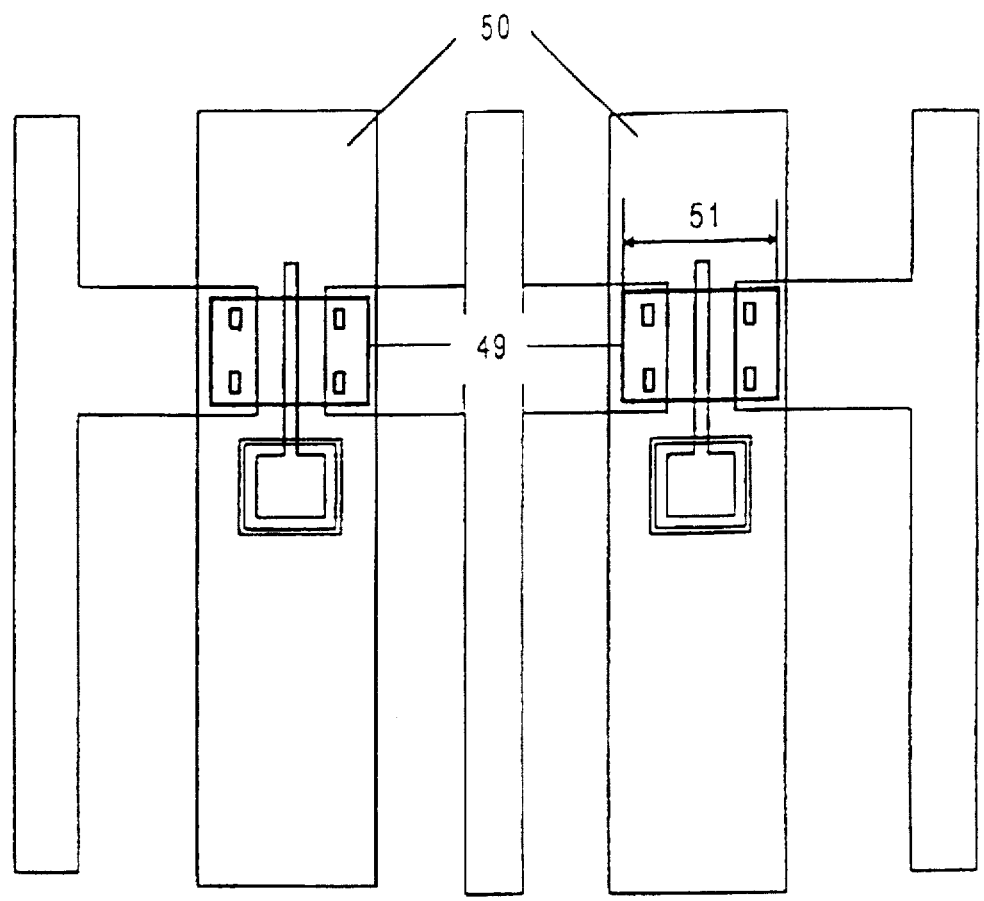
FIG. 3b is a plan view showing the active regions of the MOS transistors coming within the inductor wire.

FIGS. 3a and 3b illustrate in detail the crossing portions between the MOS transistors and the inductor. In a preferred embodiment of the present invention, a gate of a first MOS transistor is connected in series to an inductor component 29 up to a first contact point 28. A contact point 30 of a second gate is connected in series to a dispersed inductor component 31. A contact point 32 of a third gate is connected in series to an inductor component 33. A contact point 34 of a fourth gate is connected in series to an inductor component 35. All the above portions are connected in series.

Further, an extra inductor component 36 can be connected through a contact point 37 and a fourth metal wire 38 to an arbitrary terminal. Further, the inductor according to the present invention consists of a multi-layer form (1st to nth layers), each layer being insulated. Therefore, they can be connected through via holes or contact holes to the transistors.

In the present invention, four MOS transistors which have a channel width of Wμm are connected in parallel, and the channel width of the total transistors is 4×W μm. Further, the gates of the transistors are connected in series with dispersed inductors 29, 31, 33 and 35.

Thus in the present invention, the MOS transistors having a channel width of 4×W μm are disposed under the inductor, and therefore, there is not needed a separate area for the MOS transistors, with the result that the chip area is greatly reduced.

In the constitution of FIG. 2, in manufacturing the inductor, the inductor 16 and the fourth metal wire 38 are used, while in connecting the sources 25 and drains 21 of the MOS transistors, the first and second metal wires 23 and 26 are used. In the case where a fifth metal wire is used for forming a more superior inductor, fifth and fourth metal wire layers may be used in forming the inductor, while a first metal wire may be used for connecting the sources and drains of the MOS transistors. In this way, in accordance with the multi-layer wire forming technique, the present invention can be embodied in many different ways.

FIG. 3 is a plan view showing in detail the portion where the inductor and the MOS transistors of FIG. 2 cross to each other.

FIG. 3a is a plan view showing a method in which an inductor region 42 is made smaller than an active region 40, so that the parasitic capacitance between the inductor and the MOS transistors would be decreased to the minimum. A gate 43 is formed in the same direction as that of the inductor 42, and the gate 43 is connected through a connecting point 48 to the metal wire of the inductor.

In the present invention, if the metal wire of the inductor has a high stepped difference, then the usual metal wire, i.e., a multi-layer metal wire such as a metal plug is used to electrically connect the metal wire of the inductor to the transistors.

In the drawing, a source 41 (or drain 46) and a drain 46 (or source 41) are connected through a connection point 47 to a first metal wire 45 or to a second metal wire 44 which have different stepped difference from each other. Thus power is received or signals are transmitted. The device of FIG. 3a reduces the parasitic capacitance between the MOS transistors and the inductor. However, the width of the metal wire of the active element is narrow, and therefore, the resistance is increased. If the resistance is increased, the quality factor for the inductor is ultimately degraded.

In FIG. 3b, the width of a metal wire 50 of the inductor is not reduced, but an active region 49 of the MOS transistor is formed within the inductor metal wire layer. The actual metal wire of the inductor has a width of 10–30 μm, but the lateral width 51 of the MOS transistor is several μm. Therefore, in most cases, the structure of FIG. 3b is adopted.

Figure 4A:
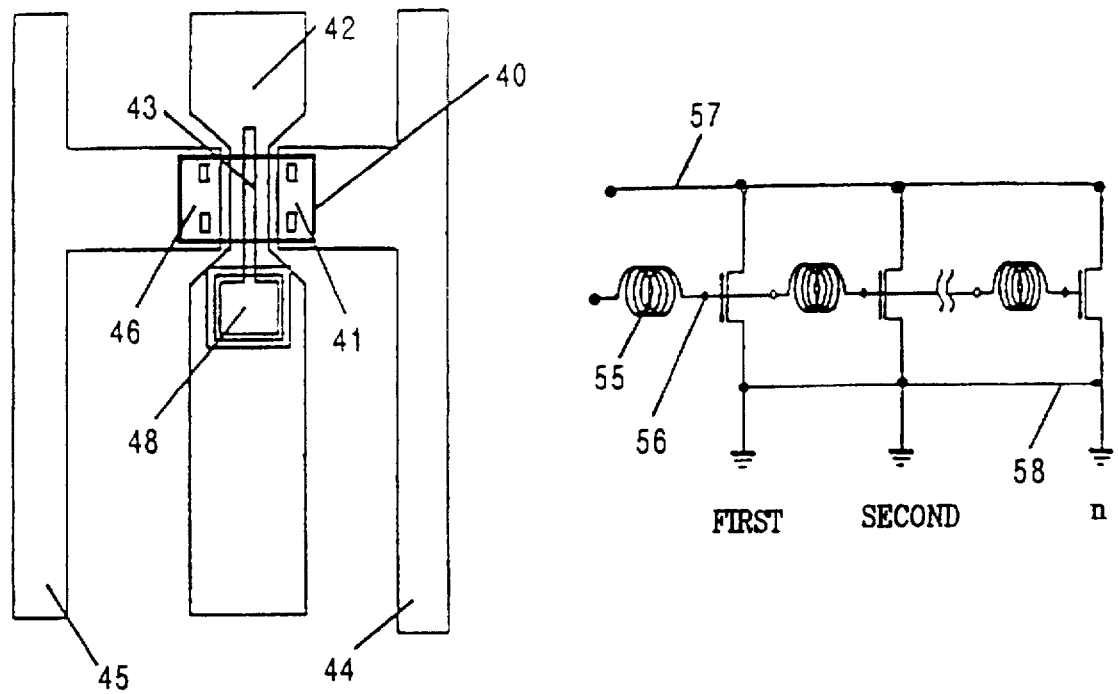
FIG. 4a is a plan view and an equivalent circuit showing the inductor connected in series to the gate.
Figure 4B:
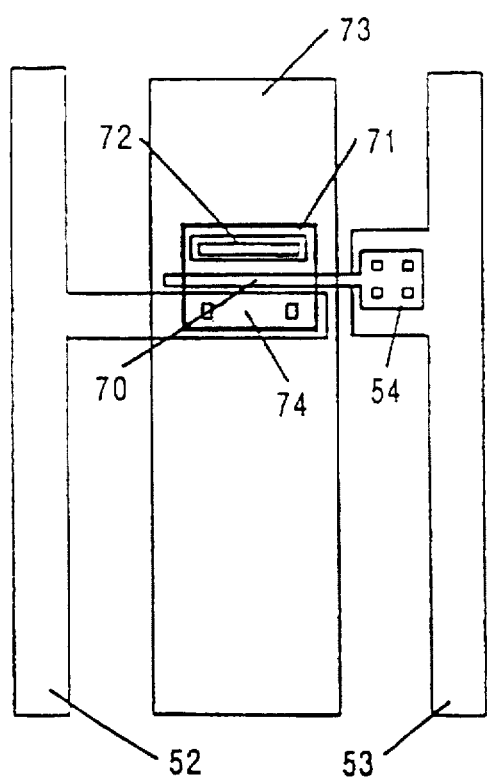
FIG. 4b is a plan view and an equivalent circuit showing the inductor connected in series to the drain.
Figure 4B:
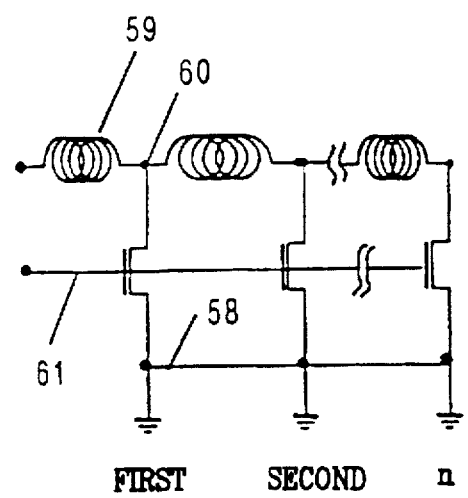

FIG. 4 illustrates a constitution which can be obtained through manipulations of the circuit by varying the electrode connection structure of the active element.

FIG. 4a is a plan view and an equivalent circuit in which the gate 43 is connected to the inductor in series. In the plan view, the source 46 and the drain 41 are connected to the metal wires 44 and 45 respectively, while in the equivalent circuit, they are a source 58 and a drain 57.

As shown in the drawing, the gate 43, the connection point 48 and the inductor 42 are connected such that the inductor 55 is connected through the connection point 56 to the gate in the equivalent circuit. In the present invention, the active elements are connected to the inductor metal wire repetitively. Therefore, circuitally viewed, the MOS transistors are connected in parallel, while the inductor is connected in series to the individual transistors.

FIG. 4b illustrates a constitution in which a gate 70 is connected through a connection point 54 to a first metal wire 53, and a drain 71 is connected through a connection point 72 to an inductor 73 in series. A source 74 is connected through a second metal wire 52 which has a stepped difference same as that of a first metal wire. In an equivalent circuit, an inductor 59 is connected through a connection point 60 of a drain in series, while a gate 61 and a source 58 are connected in parallel to each other. Particularly, the gate is expanded across the line width of the inductor 73, and the end of the expansion portion is connected to the first metal wire 53.

According to the present invention as described above, MOS transistors are internally installed within the inductor, so that the chip area would be reduced. Further, a multi-layer metal wiring technique is employed, so that diversified circuit structures needed in a matching circuit can be embodied.

What is claimed is:

1. A semiconductor circuit comprising:

a plurality of transistors having an arbitrary active region width, and formed in one row;

a first metal wire commonly connected to a part of active regions of said transistors;

a second metal wire commonly connected to a part of said active regions which are not connected to said first metal wire; and at least one or more inductor wires overlapped with gates of said transistors, and electrically connected to said gates.

2. The semiconductor circuit as claimed in claim 1, wherein said metal wires of said inductor have a width wider than that of said active region.

3. The semiconductor circuit as claimed in claim 1, wherein said active region has a width wider than that of said metal wires of said inductor.

4. The semiconductor circuit as claimed in claim 1, wherein said metal wires of said inductor are spiral, and are formed upon a plurality of said transistors.

5. The semiconductor circuit as claimed in claim 1, wherein said metal wires of said inductor are electrically connected through via holes (having different stepped differences) to said transistors which are disposed under said metal wires of said inductor.

6. The semiconductor circuit as claimed in claim 1, wherein electrical connections between said metal wires of said inductor and the plurality of said transistors are made through multi-layer metal wires.

7. A semiconductor circuit comprising:

a plurality of transistors having an arbitrary active region width, and formed in one row;

a first metal wire commonly connected to a part of active regions of said transistors;

a second metal wire commonly connected to gates of said transistors;

insulating layers and inductor metal wires alternately formed upon the plurality of said transistors;

a plurality of openings for exposing a part of said active regions of said transistors not connected to said first metal wire; and a multi-layer metal wire for electrically connecting the plurality of said transistors through the plurality of said openings to said metal wires of said inductor.

8. The semiconductor circuit as claimed in claim 7, wherein said gate is expanded across a line width of said inductor, and an end of said expansion portion is connected to said first metal wire.

9. The semiconductor circuit as claimed in claim 7, wherein said metal wires of said inductor have a width wider than that of said active region.

10. The semiconductor circuit as claimed in claim 7, wherein said active region has a width wider than that of said metal wires of said inductor.

11. The semiconductor circuit as claimed in claim 7, wherein said metal wires of said inductor are spiral, and are formed upon a plurality of said transistors.

* * * * *